(12) United States Patent
Chen et al.

(10) Patent No.: US 10,859,928 B2
(45) Date of Patent: Dec. 8, 2020

(54) EUV LIGHT SOURCE AND APPARATUS FOR LITHOGRAPHY

(71) Applicant: TAIWAN SEMICONDUCTOR MANUFACTURING CO., LTD., Hsinchu (TW)

(72) Inventors: Yu-Chih Chen, Pingtung (TW); Sheng-Kang Yu, Hsinchu (TW); Chi Yang, Taichung (TW); Shang-Chieh Chien, New Taipei (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/415,642

(22) Filed: May 17, 2019

(65) Prior Publication Data

US 2020/0004167 A1 Jan. 2, 2020

Related U.S. Application Data

(60) Provisional application No. 62/691,304, filed on Jun. 28, 2018.

(51) Int. Cl.
*G03F 7/20* (2006.01)
*H05G 2/00* (2006.01)

(52) U.S. Cl.
CPC ...... *G03F 7/70916* (2013.01); *G03F 7/70033* (2013.01); *G03F 7/70175* (2013.01); *H05G 2/005* (2013.01)

(58) Field of Classification Search
CPC ............ G03F 7/70916; G03F 7/70033; G03F 7/70175; H05G 2/005
USPC ................. 250/493.1, 494.1, 504 R
See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 2020/0057389 A1* | 2/2020 | Lin ........................ H05G 2/008 |

* cited by examiner

*Primary Examiner* — Nicole M Ippolito
(74) *Attorney, Agent, or Firm* — McDermott Will & Emery LLP

(57) ABSTRACT

An extreme ultraviolet (EUV) radiation source apparatus includes a collector and a target droplet generator for generating a tin (Sn) droplet. A debris collection device is disposed over a reflection surface of the collector, and at least one drip hole is located between the debris collection device and the collector. A tin bucket for collecting debris from the debris collection device is located below the at least one drip hole, and a tube or guide rod extends from the drip hole to the tin bucket.

20 Claims, 11 Drawing Sheets

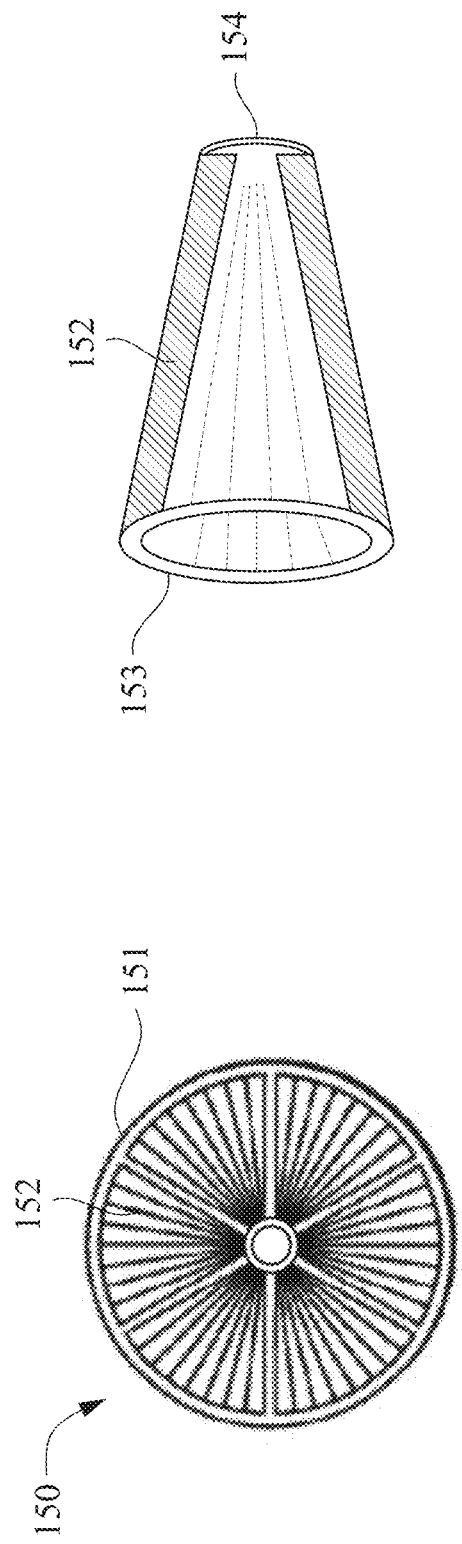
FIG. 2B
FIG. 2A
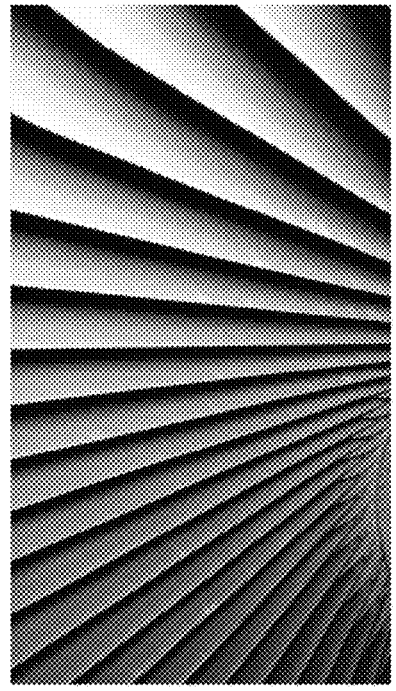
FIG. 2C

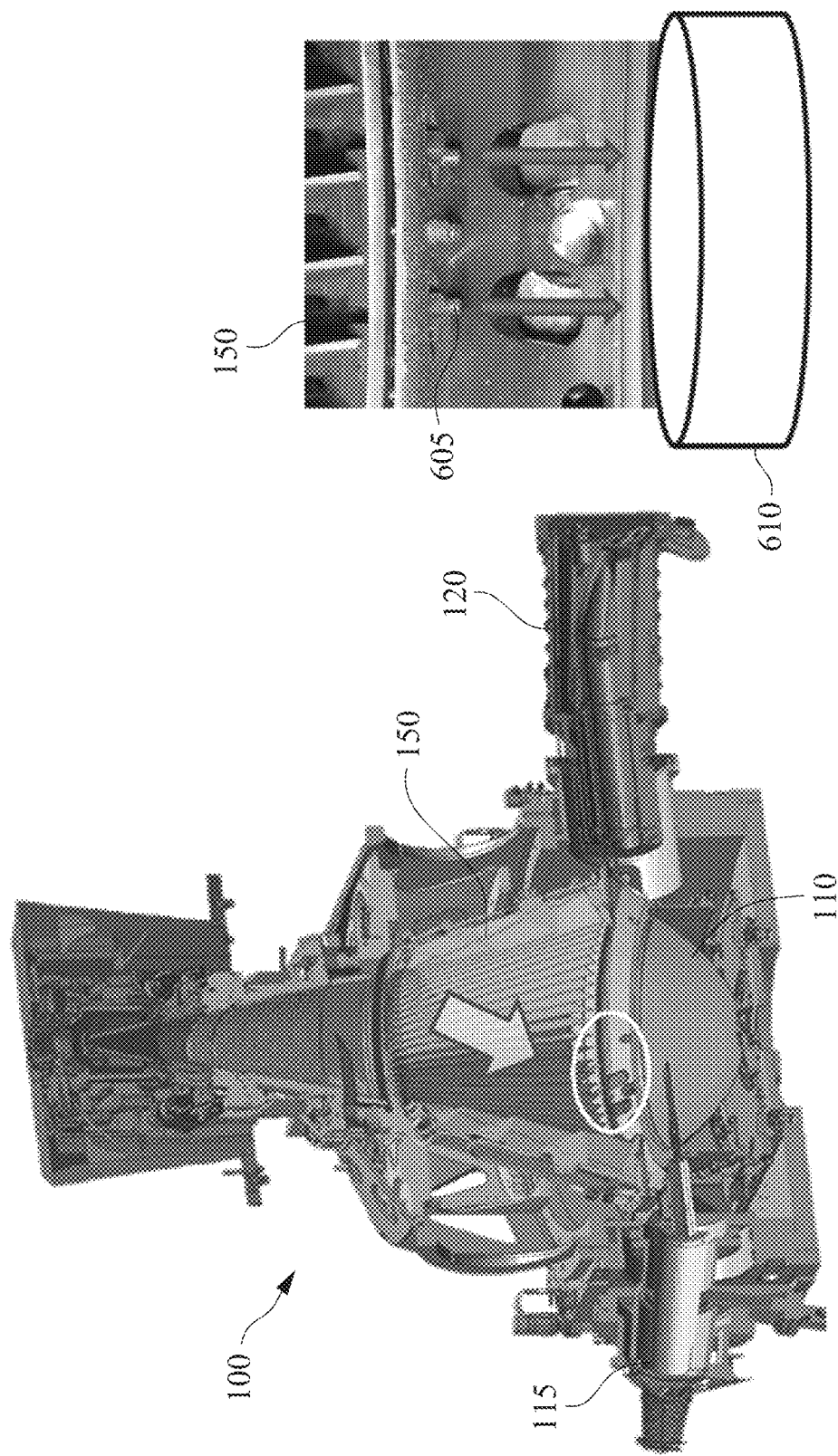

US 10,859,928 B2

EUV LIGHT SOURCE AND APPARATUS FOR LITHOGRAPHY

CROSS-REFERENCE TO RELATED APPLICATION

This application claims priority to U.S. Provisional Patent Application No. 62/691,304, filed Jun. 28, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. One type of EUV light source is laser-produced plasma (LPP). LPP technology produces EUV light by focusing a high-power laser beam onto small tin droplet targets to form highly ionized plasma that emits EUV radiation with a peak maximum emission at 13.5 nm. The EUV light is then collected by a LPP collector (collector mirror) and reflected by optics towards a lithography target, e.g., a wafer. The LPP collector is subjected to damage and degradation due to the impact of particles, ions, radiation, and most seriously, tin deposition.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A is a schematic front view of a debris collection mechanism used in the EUV radiation source according to some embodiments of the present disclosure. FIG. 2B is a schematic side view of a debris collection mechanism used in the EUV radiation source according to some embodiments of the present disclosure. FIG. 2C is a partial picture of a vane used in the EUV radiation source according to some embodiments of the present disclosure.

FIG. 4 shows a schematic view of a collector and relating portions of an EUV light source.

FIG. 5 shows a detailed view of drip holes and a debris receptacle.

DETAILED DESCRIPTION

Figure 1A:
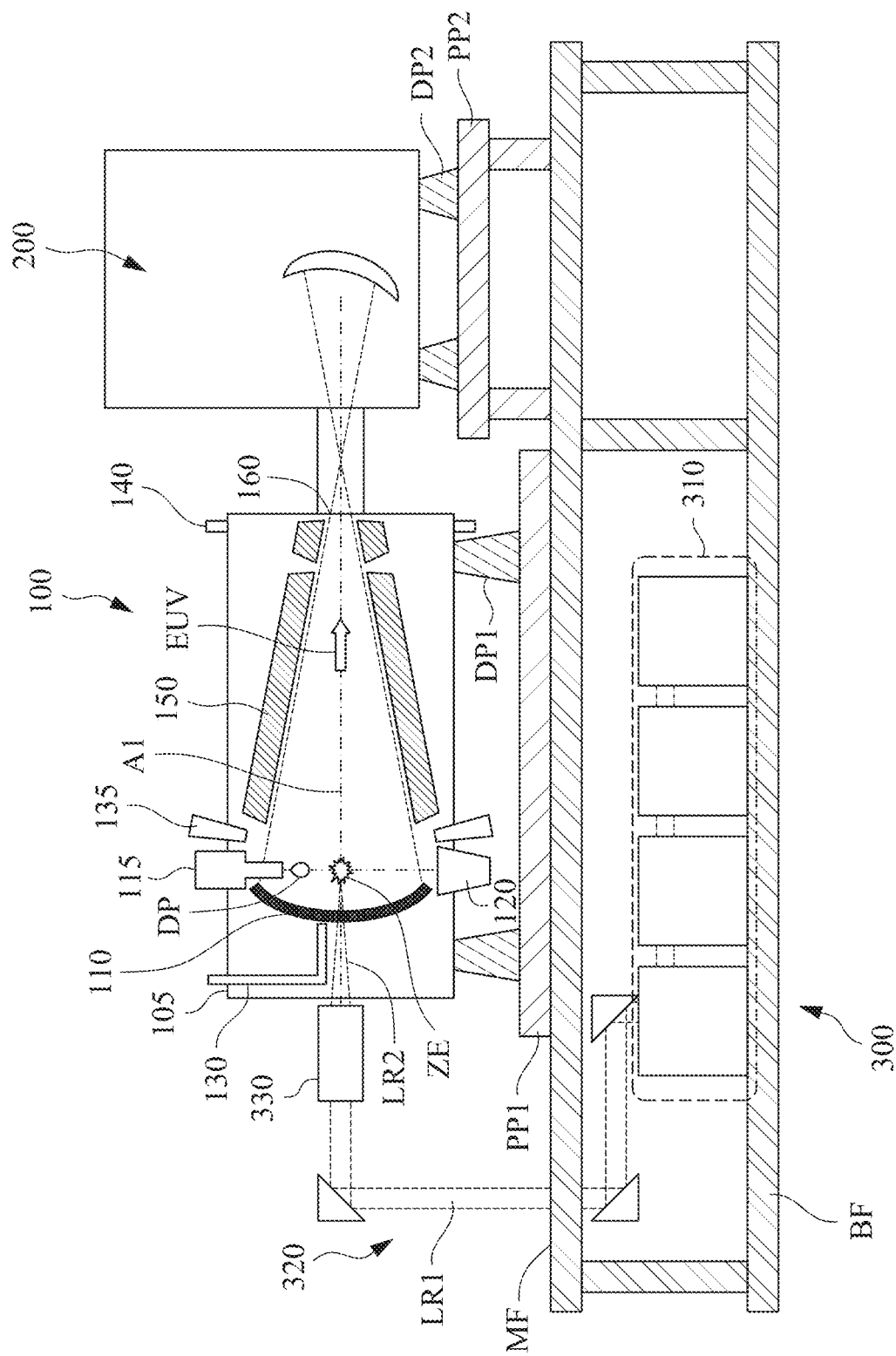
FIG. 1A is a schematic view of an EUV lithography system with a laser produced plasma (LPP) EUV radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to extreme ultraviolet (EUV) lithography system and methods. More particularly, it is related to apparatus and methods for mitigating contamination on a collector in a laser produced plasma (LPP) EUV radiation source. The collector, also referred to as an LPP collector mirror or an EUV collector mirror, is an important component of the LPP EUV radiation source. It collects and reflects EUV radiation and contributes to overall EUV conversion efficiency. However, it is subjected to damage and degradation due to the impact of particles, ions, radiation, and debris deposition. In particular, tin (Sn) debris is one of the contamination sources of the EUV collector. EUV collector life time, the duration of the reflectivity decays to half of itself, is one of the most important factors for an EUV scanner. The major reason for decay of the collector is the residual metal contamination (tin debris) on the collector surface caused by the EUV light generation procedure.

Embodiments of the present disclosure are directed to reducing debris deposition onto the LPP collector thereby increasing its usable lifetime. More specifically, embodiments of this disclosure are directed to self-destroying a metallic coating and accumulation on the EUV collector by active heating thereof up to a melting temperature of tin debris and a drain structure design. The technology of this disclosure keeps the collector in a desirable status for a longer period of time by reducing the frequency of swapping the collector. In other words, an EUV scanner will maintain the highest exposure power and throughput, and require less frequent maintenance, thereby reducing the week-long down time required to swap the collector.

FIG. 1A is a schematic and diagrammatic view of an EUV lithography system. The EUV lithography system includes an EUV radiation source apparatus 100 to generate EUV light, an exposure tool 200, such as a scanner, and an excitation laser source apparatus 300. As shown in FIG. 1A, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

Figure 1B:
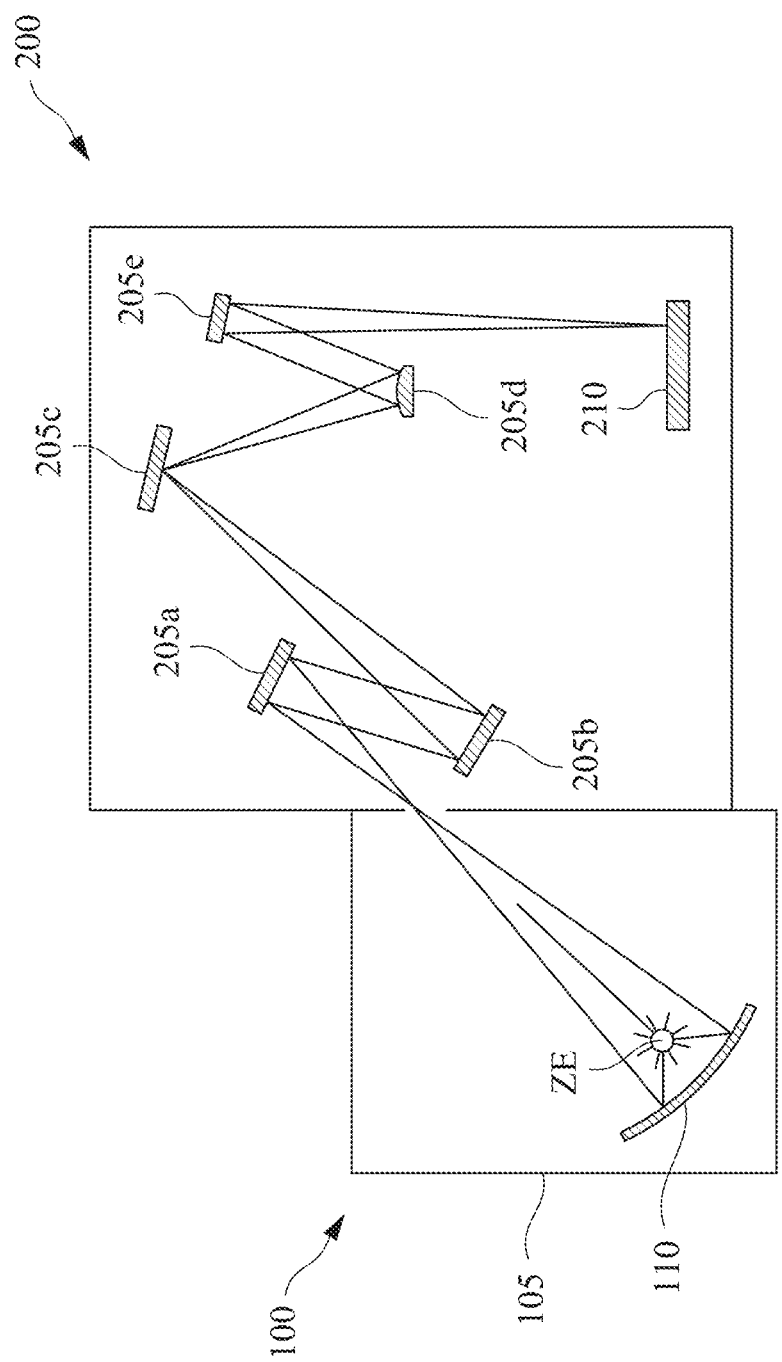
FIG. 1B is a schematic view of an EUV lithography system exposure tool according to embodiments of the disclosure.

FIG. 1B is a simplified schematic diagram of a detail of an extreme ultraviolet lithography tool according to an embodiment of the disclosure showing the exposure of photoresist coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 1B, the EUVL tool includes an EUV light source 100 including plasma at ZE emitting EUV light in a chamber 105 that is collected and reflected by a collector 110 along a path into the exposure device 200 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped $SiO_2$, or other suitable materials with low thermal expansion. The mask includes multiple reflective multiple layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules.

As shown in FIG. 1A, the EUV radiation source 100 includes a target droplet generator 115 and a LPP collector 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns (μm). In some embodiments, the tin droplets DP are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation layer includes a pre-heat laser and a main laser. The pre-heat laser pulse is used to heat (or pre-heat) the target droplet to create a low-density target plume, which is subsequently heated (or reheated) by the main laser pulse, generating increased emission of EUV light.

In various embodiments, the pre-heat laser pulses have a spot size about 100 μm or less, and the main laser pulses have a spot size about 200-300 μm.

The laser pulses LR2 are generated by the excitation laser source 300. The laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source. The laser light LR1 generated by the laser generator 300 is guided by the laser guide optics 320 and focused into the excitation laser LR2 by the focusing apparatus 330, and then introduced into the EUV radiation source 100.

The laser light LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the collector mirror 110. The collector 110 has a reflection surface that reflects and focuses the EUV radiation for the lithography exposing processes. In some embodiments, a droplet catcher 120 is installed opposite the target droplet generator 115. The droplet catcher 120 is used for catching excess target droplets. For example, some target droplets may be purposely missed by the laser pulses.

The collector 110 includes a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes multiple layers (such as a plurality of Mo/Si film pairs) and may further include a capping layer (such as Ru) coated on the multiple layers to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern in some embodiments.

In such an EUV radiation source apparatus, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure tool 200.

As shown in FIG. 1A, in some embodiments, a buffer gas is supplied from a first buffer gas supply 130 through the aperture in collector 110 by which the pulse laser is delivered to the tin droplets. In some embodiments, the buffer gas is $H_2$, He, Ar, $N_2$, or another inert gas. In certain embodiments, $H_2$ is used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching to the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200.

To trap the $SnH_4$ or other debris, one or more debris collection mechanisms or devices 150 are employed in the chamber 105.

As shown in FIG. 1A, one or more debris collection mechanisms or devices 150 are disposed along optical axis A1 between the zone of excitation ZE and an output port 160 of the EUV radiation source 100. FIG. 2A is a front view of the debris collection mechanism 150 and FIG. 2B is a schematic side view of the debris collection mechanism 150. FIG. 2C is a picture of a portion of the debris collection mechanism 150. The debris collection mechanism 150 includes a frustoconical support frame 151, a first end support 153 and a second end support 154 that operably support a plurality of vanes 152 that rotate within the housings. The first end support 153 has a larger diameter than the second end support 154. The debris collection mechanism 150 serves to prevent the surface of collector 110 and/or other elements/portions of the inside the chamber 105 from being coated by Sn vapor by sweeping out slow Sn atoms and/or $SnH_4$ via rotating vanes 152.

The plurality of vanes 152 project radially inwardly from the frustoconical support frame 151. The vanes 152 are thin and elongate plates. In some embodiments, each of the vanes has a triangular or trapezoid or trapezium shape in plan view. The vanes 152 are aligned so that their longitudinal axes are parallel to the optical axis A1 so that they present the smallest possible cross-sectional area to the EUV radiation EUV. The vanes 152 project towards the optical axis A1, but do not extend as far as the optical axis. In some embodiments, a central core of the debris collection mechanism 150 is empty. The debris collection mechanism 150 is rotated by a drive unit including one or more motors, one or more belts and/or one or more gears, or any rotating mechanism. The vanes 152 are heated at 100° C. to 400° C. by a heater in some embodiments.

Figure 3B:
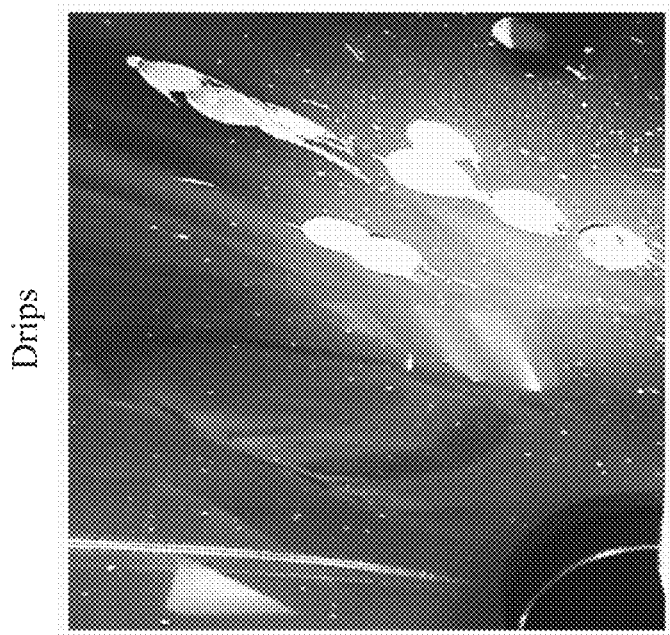
FIGS. 3A, 3B, and 3C show debris covered collectors.
Figure 3A:
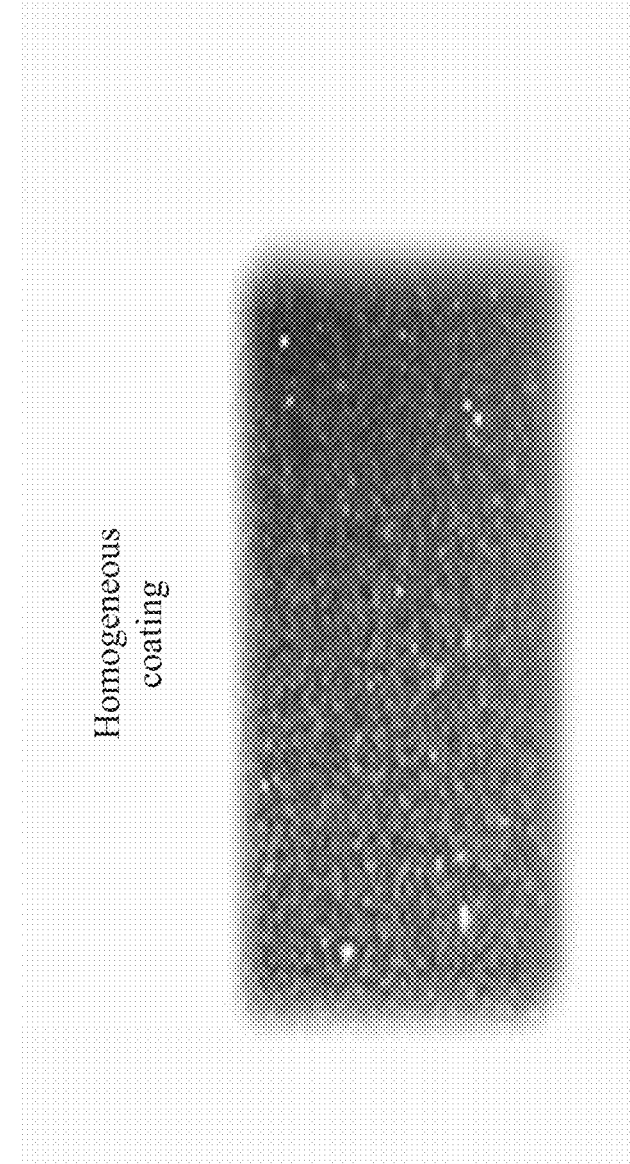
Figure 3D:
FIG. 3D shows clogged drip holes.
Figure 3C:
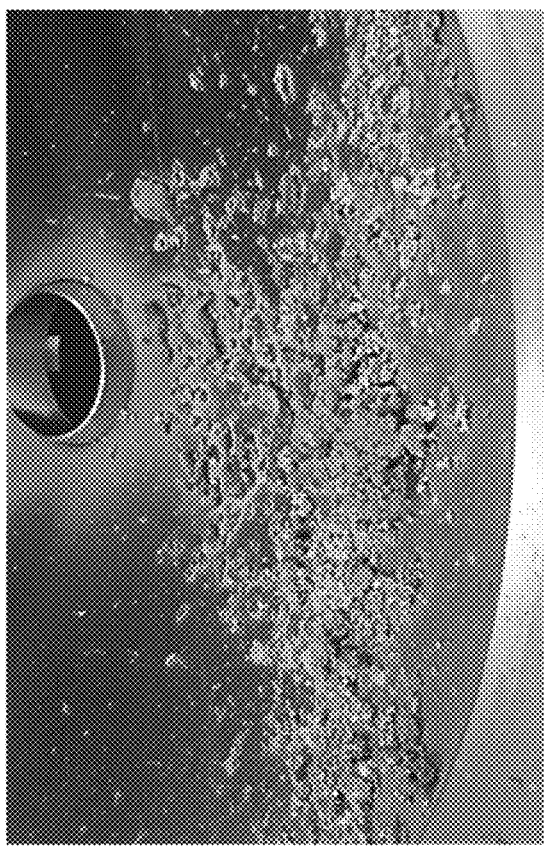

FIGS. 3A, 3B, and 3C show various surface conditions with debris. In FIG. 3A there is a substantially homogenous coating of debris on the surface of the collector. FIGS. 3B and 3C shows drips and drops of debris, respectively, such as drips and drops of Sn on the surface of the collector. FIG. 3D shows drip holes at the base of the debris collection mechanism clogged with condensed tin debris. Debris coating, drips, and drops degrade the efficiency of the collector, as they may block, absorb, or scatter EUV radiation. Embodiments of the disclosure inhibit the formation of debris coating, drips, and drops on the surface of the collector, thereby increasing the service interval between changing the collector.

Debris swept up by the vanes 152 condenses and falls to the bottom of the debris collection mechanism 150 where it passes through drip holes and is subsequently collected in a debris receptacle (or tin bucket), outside of the optical path of the EUV radiation source 100. If the tin debris cools too much en route to the tin bucket it can form stalactites and block the drip holes.

As set forth above, collector contamination due to the residual metal by the EUV light generation procedure is a major cause of the EUV scanner exposure power loss and throughput down trend. For example, the collector life time is generally maintained at about 3 months and then it is generally necessary to take a week or more down time to swap the collector with a new collector to maintain high exposure power and throughput. Manufacturing output can be increased by increasing the collector life time and decreasing the frequency of swapping collectors.

FIG. 4 shows a schematic view of the EUV radiation source 100, including the debris collection mechanism 150, collector 100, target droplet generator 115, and droplet catcher 120. The circled area in FIG. 4 is shown close up in FIG. 5. As shown in FIG. 5, in some embodiments, there are plurality of drip holes (or fluid passages) 605 located adjacent the bottom of the vanes 152 of the debris collection mechanism. As shown by the arrows in FIG. 5, molten debris, such as excess tin, passes through the drip holes (or fluid passages) 605 and into the debris receptacle (or tin bucket) 610. The debris receptacle 610 is located outside of the optical path of the EUV radiation source 100. In some embodiments, the debris receptacle 610 is located inside the chamber 105 adjacent the collector 110.

In some embodiments, the debris receptacle 610 is located behind the collector 110 of FIG. 4. In some embodiments, the debris receptacle 610 is made of material suitable for collecting molten debris, such as molten tin. In some embodiments, the debris receptacle 610 is made of a steel. The tin bucket 610 can be cleaned, emptied, or replaced during routine maintenance of the EUV radiation source, such as when swapping out the collector 110.

Figure 6:
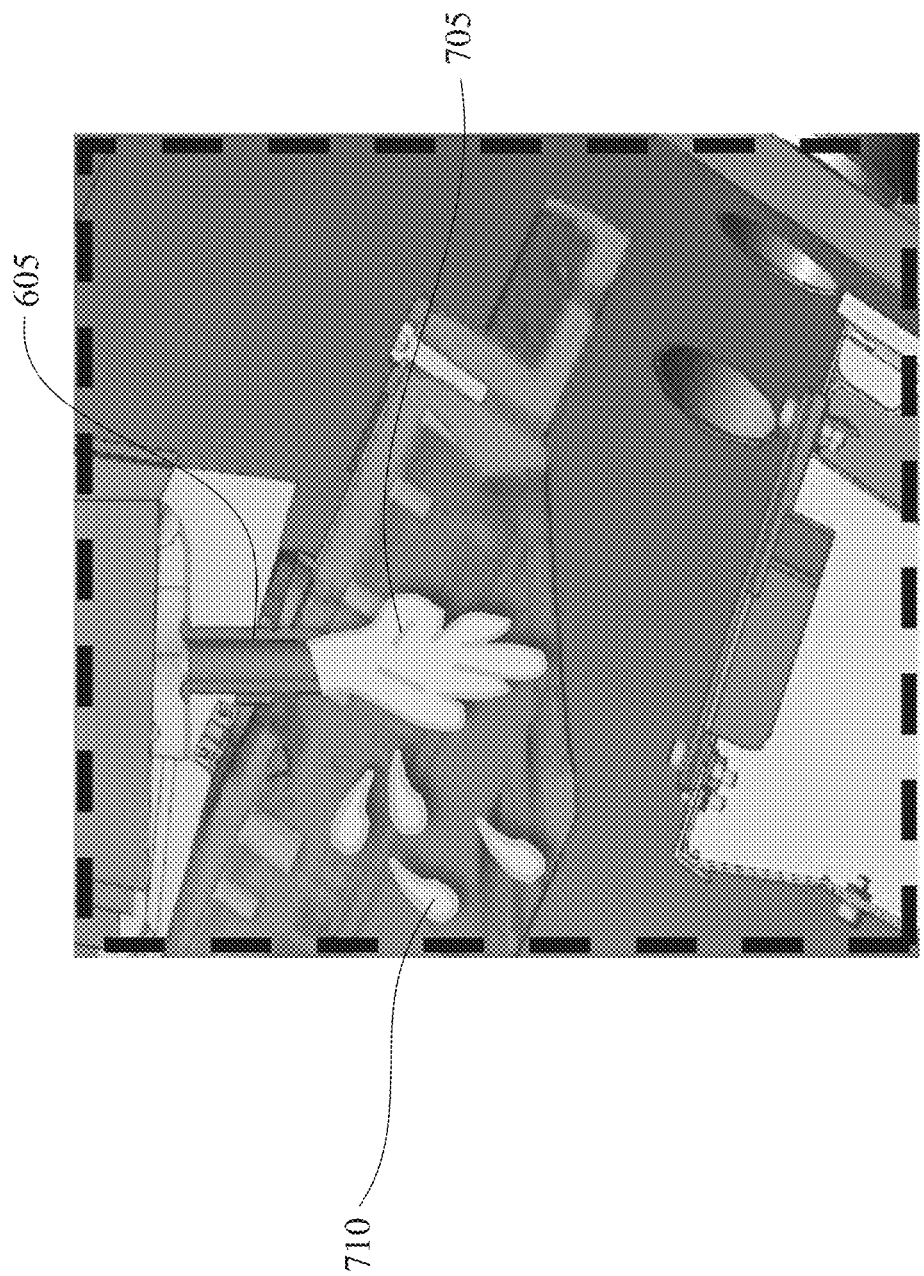
FIG. 6 is a view of drip hole clogged by a stalactite clog.

FIG. 6 shows a condensed tin debris stalactite 705 formed at the outlet of the drip hole 605. During operation of the EUV radiation source, the EUV radiation source may go through rapid temperature swings causing the stalactite 705 to rapidly heat up and cause spitting 710, in which molten or vaporized debris is ejected from surface of the stalactite 705. The "spit" debris may deposit on the collector and thereby shorten the collector lifespan.

Figure 7:
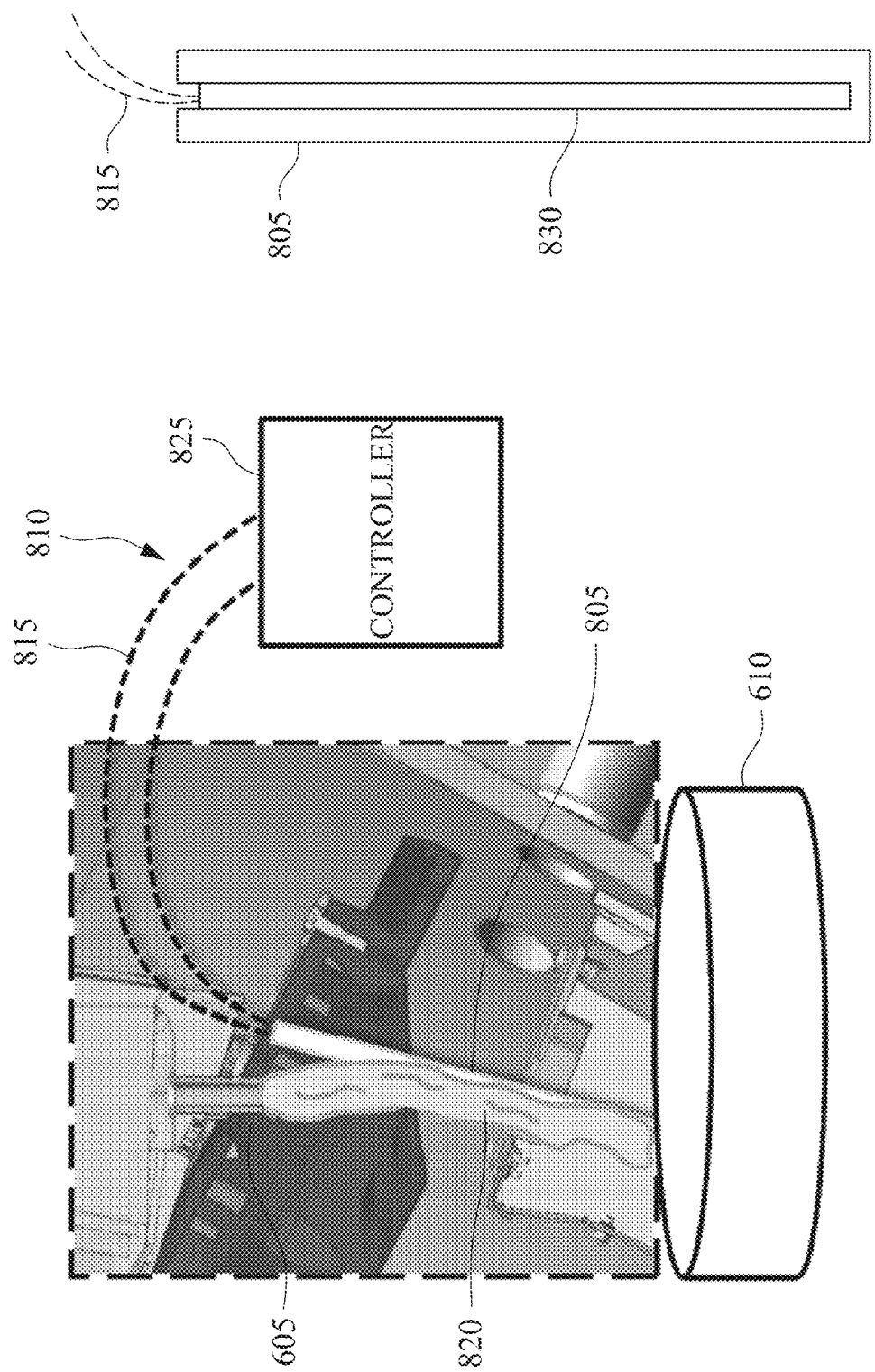
FIG. 7A is a view of an embodiment of the disclosure.
FIG. 7B is a detailed view of a guide rod.

According to embodiments of the disclosure, a heated guide rod 805 is located adjacent the drip hole 705, as shown in FIG. 7A. FIG. 7A is a detailed view of the highlighted portion of FIG. 6. Debris 820 passing through the drip hole 605 contacts the heated guide rod 805 and runs down the guide rod 805 to the receptacle (or tin bucket) 610. The heated guide rod 805 is heated to a temperature above the melting point of the debris 820 using a heater 810. In the case of tin debris, the guide rod is heated to a temperature greater than 232° C. (i.e.—greater than the melting point of tin). In some embodiments, the guide rod is heated to a temperature ranging from about 180° C. to about 500° C. depending on the target droplet material melting point.

The heater 810 includes a power supply and controller 825 connected to a heating element 830 via electrically conductive lines 815. In some embodiments, the heating element 830 is an electrical resistance heating element. In some embodiments, the heating element 830 is located in a hollow interior portion of the guide rod 805, as shown in FIG. 7B. FIG. 7B is a cross-sectional detailed view of the guide rod 805 illustrated in FIG. 7A. In some embodiments, the controller 825 controls the heater 810 to maintain the temperature of the guide rod 805 within a desired temperature range. In some embodiments, the guide rod 805 is maintained in a temperature range of about 180° C. to about 500° C. depending on the target droplet material or debris material. When the target droplets are made of tin the guide rod 805 temperature is maintained at a temperature of equal to or greater than 232° C. in some embodiments.

In some embodiments, the guide rod 805 is made of a thermally conductive material that can withstand the desired temperature and does not react with the molten tin debris. In some embodiments, the guide rod 805 is made of a suitable metal, ceramic, or high temperature resistant polymer. In some embodiments, the thermally conductive material is a metal selected from the group consisting of aluminum, brass, nickel, steel, tungsten, and zinc. In some embodiments, the high temperature polymer is selected from the group consisting of polyetherketones, polyetheretherketones, polyamideimides, polyetherimides, polybenzimidazoles, and polyphenylene sulfides.

Figure 8:
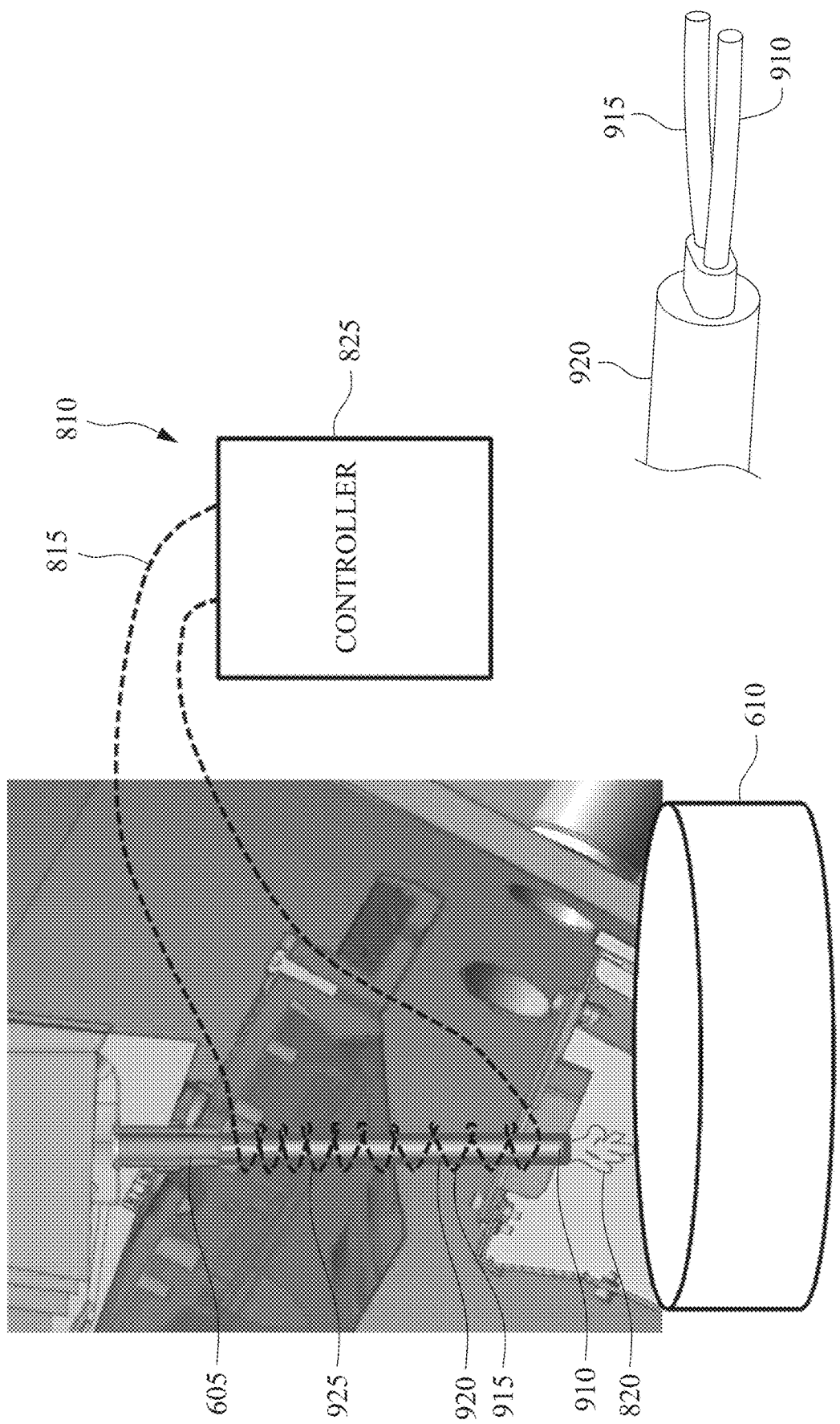
FIG. 8A is a view of another embodiment of the disclosure.
FIG. 8B is a detailed view of the cladded tube according to an embodiment of the disclosure.

In another embodiment of the present disclosure, a tube 910 is used to direct the molten debris 820 from the drip hole 505 to the debris receptacle 610, as shown in FIG. 8A. The heated tube 910 is heated to a temperature above the melting point of the debris 820 using a heater 810. In the case of tin debris, the tube 910 is heated to a temperature greater than 232° C. (i.e.—greater than the melting point of tin). In some embodiments, the tube is heated to a temperature ranging from about 180° C. to about 500° C. depending on the target droplet material melting point.

The heater 810 includes a power supply and controller 825 connected to a heating element 925 via electrically conductive lines 815. In some embodiments, the heating element 925 is an electrical resistance heating element. In some embodiments, the heating element 925 is a heating tape wrapped around the tube 910. In some embodiments, the tube 910 is a cladded tube surrounded by an insulating cladding material 920. A detailed view of the cladded tube is shown in FIG. 8B. As shown, in some embodiments, the tube 910 is embedded in the central portion of insulating cladding 920. The heating element 915 adjacent to the tube 910 is also embedded in the cladding 920.

In some embodiments, the controller 825 controls the heater 810 to maintain the temperature of the tube 910 within a desired temperature range. In some embodiments, the tube 910 is maintained in a temperature range of about 180° C. to about 500° C. depending on the target droplet material or debris material. When the target droplets are made of tin the tube 910 temperature is maintained at a temperature of greater than 232° C. in some embodiments.

In some embodiments, the tube 910 is made of a thermally conductive material that can withstand the desired temperature and does not react with the molten tin debris. In some embodiments, the tube 910 is made of a suitable metal, ceramic, or high temperature resistant polymer. In some embodiments, the thermally conductive material is a metal selected from the group consisting of aluminum, brass, nickel, steel, tungsten, and zinc. In some embodiments, the high temperature polymer is selected from the group consisting of polyetherketones, polyetheretherketones, polyamideimides, polyetherimides, polybenzimidazoles, and polyphenylene sulfides.

In some embodiments, the tube 910 extends from the drip hole 605 into the debris receptacle 610. To reduce the possibility of the debris 820 contaminating the collector 110 the debris is not exposed to the EUV radiation source ambient as it passes through the tube 910 to the debris receptacle 610.

Figure 9:
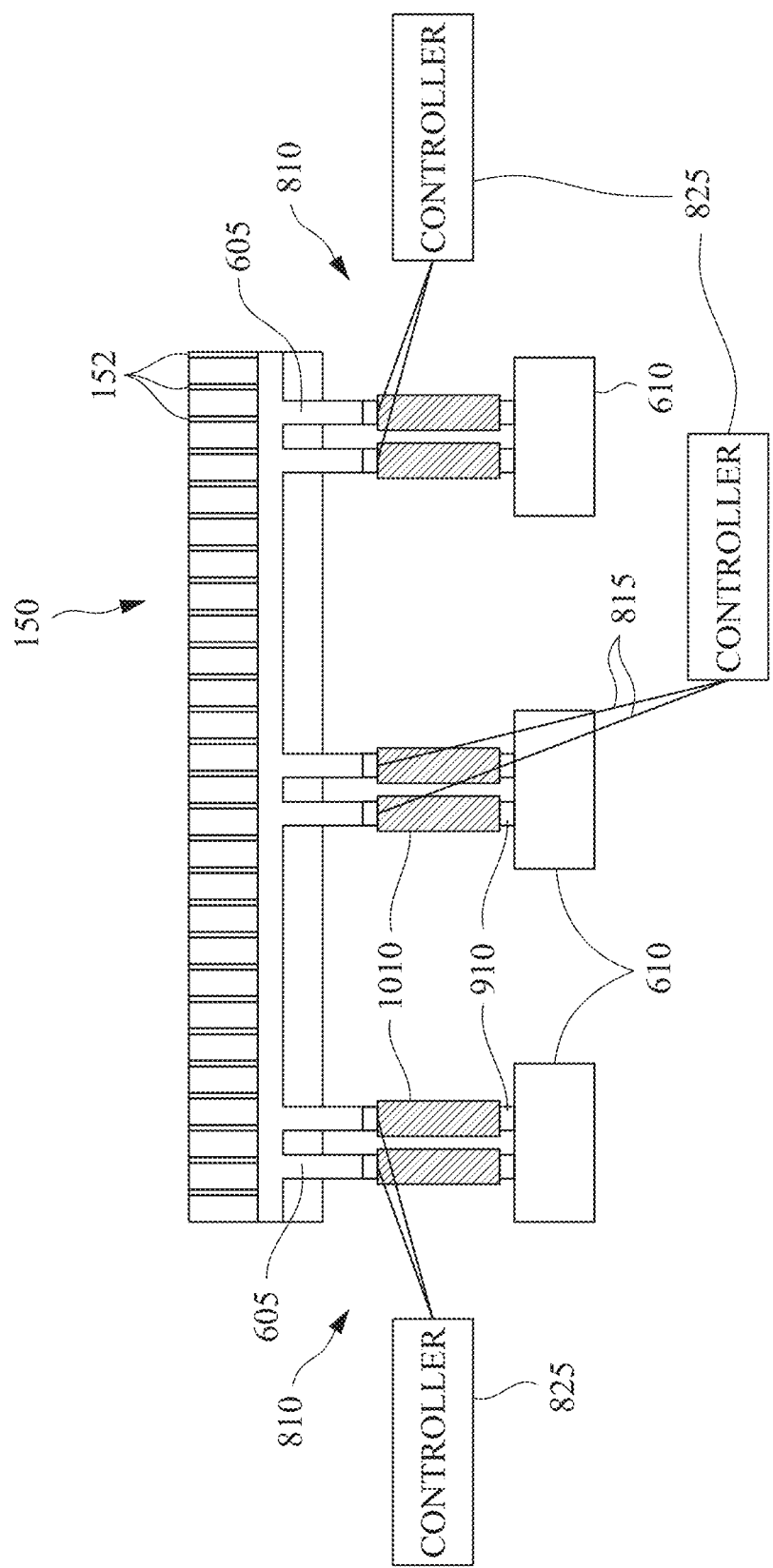
FIG. 9 is a view of another embodiment of the disclosure.

As shown in FIG. 9, in some embodiments, the EUV radiation source apparatus includes: a plurality of drip holes 605 located below a lower circumference of the debris collection device 150; a plurality of debris receptacles 610, wherein each debris receptacle 610 is located below at least one of the drip holes 605; and a plurality of tubes 910, wherein each tube 910 extends from one of the drip holes 605 to one of the debris receptacles. FIG. 9 is a detailed illustration showing a cross sectional portion of the debris collection device 150 and vanes 152. In some embodiments, the debris receptacles 610 are tin buckets. In some embodiments, heaters 810 include a power supply and controller 825, a heating element 1010, such as a heating tape, wrapped around the tube 910, and electrically conductive lines 815 connecting the heating element 1010 to the power supply and controller 825. In some embodiments, guide rods are used instead of tubes 910, and in some embodiments, the heating element is located in a hollow portion of the guide rod.

Figure 10:
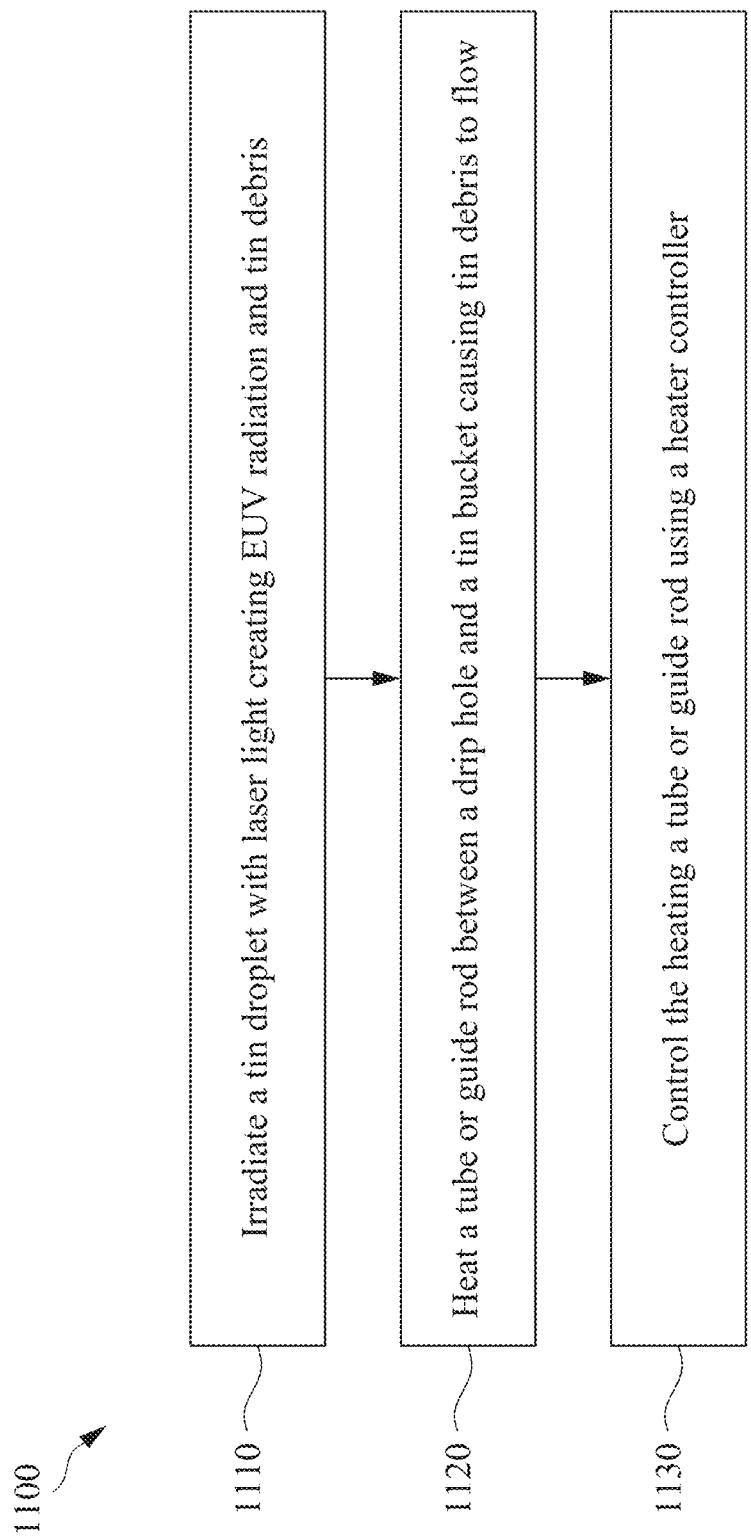
FIG. 10 is a flowchart illustrating method according to an embodiment of the disclosure.

FIG. 10 is a flowchart illustrating a method 1100 for generating extreme ultraviolet radiation according to an embodiment of the disclosure. The method includes an operation 1110 of irradiating a tin droplet with laser light in an EUV radiation source apparatus, thereby creating the EUV radiation and tin debris. A tube or guide rod between a drip hole and a tin bucket is heated in operation 1120, thereby causing tin debris deposited about the drip hole to flow. In some embodiments, the tin debris flows into a tin bucket. In some embodiments, the tin bucket is outside optical path of the extreme ultraviolet radiation. In some embodiments, the heating of the tube or guide rod is controlled using a heater controller in operation 1130. In an embodiment, the heating a tube or guide rod comprises applying electrical resistance heating using a heating element connected to the tube or guide rod.

Embodiments of the present disclosure are directed to reducing debris deposition onto the LPP collector thereby increasing its usable lifetime. Embodiments of the disclosure are directed to self-destroying a metallic coating and accumulation on the EUV collector by providing a heated guide or tube between the drip holes and the debris receptacle. Embodiments of the disclosure mitigate the impact of reflectivity loss due to tin debris contamination of the collector. Thus, the collector is maintained in a desirable status for a longer period of time and the frequency of swapping the collector is reduced. Therefore, an EUV lithography system according to the disclosure will maintain the highest exposure power and throughput, and require less frequent maintenance, thereby reducing the frequency of the week-long down time required to swap the collector.

An embodiment of the disclosure is an extreme ultraviolet (EUV) radiation source apparatus, including a collector and a target droplet generator for generating a tin (Sn) droplet. A debris collection device is disposed over a reflection surface of the collector, and at least one drip hole is located between the debris collection device and the collector. A tin bucket for collecting debris from the debris collection device is located below the at least one drip hole, and a tube or guide rod extends from the drip hole to the tin bucket. In an embodiment, the EUV radiation source apparatus includes a heater connected to the tube or guide rod. In an embodiment, the heater further comprises a heater controller to control heating of the tube or guide rod. In an embodiment, the heater includes heating tape wrapped around the tube. In an embodiment, the tube is clad and a portion of the heater is embedded in cladding surrounding the tube. In an embodiment, the guide rod includes a hollow portion and the heater includes a heating element located in the hollow portion of the guide rod. In an embodiment, the tube or guide rod comprises a thermally conductive metal. In an embodiment, the thermally conductive metal is selected from the group consisting of aluminum, brass, nickel, steel, tungsten, and zinc. In an embodiment, the EUV radiation source apparatus includes: a plurality of drip holes located below a lower circumference of the debris collection device; a plurality of tin buckets, wherein each tin bucket is located below at least one of the drip holes; and a plurality of tubes or guide rods, wherein each tube or guide rod extends from one of the drip holes to one of the tin buckets. In an embodiment, the EUV radiation source apparatus includes a plurality of heaters, wherein each heater is connected to one of the tubes or guide rods.

Another embodiment of the present disclosure is an extreme ultraviolet (EUV) radiation source apparatus, including an ellipsoidal EUV reflector and a target droplet generator. A frustoconical-shaped debris collection mechanism is disposed over the ellipsoidal EUV reflector, wherein the frustoconical-shaped debris collection mechanism comprises a plurality of vanes extending between an upper annular-shaped support frame and a lower annular-shaped support frame. A fluid passage is located below the vanes, a receptacle is located below the fluid passage, and a tube or rod extends from the fluid passage to the receptacle. In an embodiment, the EUV radiation source apparatus includes a heater connected to the tube or rod. In an embodiment, the heater includes a heater controller to control heating of the tube or rod. In an embodiment, the heater comprises heating tape wrapped around the tube. In an embodiment, the rod includes a hollow portion and the heater includes a heating element located in the hollow portion of the rod.

In another embodiment of the disclosure, an extreme ultraviolet (EUV) lithography apparatus includes an excitation laser source, and an EUV radiation source coupled to the excitation laser source. An exposure tool is coupled to the EUV radiation source. The excitation laser source provides excitation laser radiation for interacting with target metal droplets in the EUV radiation source to generate EUV radiation. The EUV radiation generated by interaction with the excitation laser radiation is introduced into the exposure tool where the EUV radiation is directed toward a resist-coated substrate. The EUV radiation source includes a collector for reflecting and directing the EUV radiation toward the exposure tool, and a target droplet generator for generating the target droplets. A debris collection device is disposed over the collector, and a drip hole is located between the debris collection device and the collector. A receptacle for collecting debris from the debris collection device is located below the drip hole. A tube or guide rod extends from the drip hole to the receptacle, and a heater is coupled to the tube or guide rod. In an embodiment, the guide rod includes a hollow portion and the heater includes a heating element located in the hollow portion of the guide rod. In an embodiment, the heater includes a heating element wrapped around the tube. In an embodiment, the heater includes a heater controller to control heating of the tube or guide rod. In an embodiment, the tube or guide rod includes a thermally conductive metal.

In another embodiment of the disclosure, a method for generating an extreme ultraviolet (EUV) radiation, includes irradiating a tin droplet with laser light in an EUV radiation source apparatus, thereby creating the EUV radiation and tin debris. A tube or guide rod between a drip hole and a tin bucket is heated, thereby causing tin debris deposited about the drip hole to flow. In an embodiment, the heating a tube or guide rod comprises applying electrical resistance heating using a heating element connected to the tube or guide rod. In an embodiment, the heating element is a heating tape wrapped around the tube. In an embodiment, the guide rod includes a hollow portion and the heating element is located in the hollow portion. In an embodiment, the method includes controlling the heating a tube or guide rod using a heater controller connected to the heating element.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) radiation source apparatus, comprising:
    a collector;
    a target droplet generator for generating a tin (Sn) droplet;
    a debris collection device disposed over a reflection surface of the collector;
    at least one drip hole located between the debris collection device and the collector;
    a bucket for collecting tin debris from the debris collection device located below the at least one drip hole; and
    a tube or guide rod extending from the drip hole to the bucket for collecting tin debris.

2. The EUV radiation source apparatus of claim 1, further comprising a heater connected to the tube or guide rod.

3. The EUV radiation source apparatus of claim 2, wherein the heater further comprises a heater controller to control heating of the tube or guide rod.

4. The EUV radiation source apparatus of claim 2, wherein the heater comprises heating tape wrapped around the tube.

5. The EUV radiation source apparatus of claim 2, wherein the tube is clad and a portion of the heater is embedded in cladding surrounding the tube.

6. The EUV radiation source apparatus of claim 2, wherein the guide rod includes a hollow portion and the heater includes a heating element located in the hollow portion of the guide rod.

7. The EUV radiation source apparatus of claim 1, wherein the tube or guide rod comprises a thermally conductive metal.

8. The EUV radiation source apparatus of claim 7, wherein the thermally conductive metal is selected from the group consisting of aluminum, brass, nickel, steel, tungsten, and zinc.

9. The EUV radiation source apparatus of claim 1, comprising:
    a plurality of drip holes located below a lower circumference of the debris collection device;
    a plurality of buckets for collecting tin debris, wherein each bucket is located below at least one of the drip holes; and
    a plurality of tubes or guide rods, wherein each tube or guide rod extends from one of the drip holes to one of the buckets.

10. The EUV radiation source apparatus of claim 9, comprising a plurality of heaters, wherein each heater is connected to one of the tubes or guide rods.

11. An extreme ultraviolet (EUV) radiation source apparatus, comprising:
    an ellipsoidal EUV reflector;
    a target droplet generator;
    a frustoconical-shaped debris collection mechanism disposed over the ellipsoidal EUV reflector, wherein the frustoconical-shaped debris collection mechanism comprises a plurality of vanes extending between an upper annular-shaped support frame and a lower annular-shaped support frame;
    a fluid passage located below the plurality of vanes;
    a receptacle located below the fluid passage; and
    a tube or rod extending from the fluid passage to the receptacle.

12. The EUV radiation source apparatus of claim 11, further comprising a heater connected to the tube or rod.

13. The EUV radiation source apparatus of claim 12, wherein the heater further comprises a heater controller to control heating of the tube or rod.

14. The EUV radiation source apparatus of claim 12, wherein the heater comprises heating tape wrapped around the tube.

15. The EUV radiation source apparatus of claim 12, wherein the rod includes a hollow portion and the heater includes a heating element located in the hollow portion of the rod.

16. A method for generating an extreme ultraviolet (EUV) radiation, comprising:
    irradiating a tin droplet with laser light in an EUV radiation source apparatus, thereby creating the EUV radiation and tin debris; and
    heating a tube or guide rod between a drip hole and a bucket for collecting tin debris, thereby causing the tin debris deposited about the drip hole to flow.

17. The method according to claim 16, wherein the heating the tube or guide rod comprises applying electrical resistance heating using a heating element connected to the tube or guide rod.

18. The method according to claim 17, wherein the heating element is a heating tape wrapped around the tube.

19. The method according to claim 17, wherein the guide rod includes a hollow portion and the heating element is located in the hollow portion.

20. The method according to claim 17, further comprising controlling the heating a tube or guide rod using a heater controller connected to the heating element.

* * * * *